(12) United States Patent
Kubouchi et al.

(10) Patent No.: US 7,940,587 B2
(45) Date of Patent: May 10, 2011

(54) SEMICONDUCTOR MEMORY DEVICE AND TEST METHOD THEREOF

(75) Inventors: Shuichi Kubouchi, Tokyo (JP); Jun Suzuki, Tokyo (JP)

(73) Assignee: Elpida Memory Inc., Tokyo (JP)

( * ) Notice: Subject to any disclaimer, the term of this patent is extended or adjusted under 35 U.S.C. 154(b) by 100 days.

(21) Appl. No.: 12/426,624

(22) Filed: Apr. 20, 2009

(65) Prior Publication Data
US 2009/0268534 A1 Oct. 29, 2009

(30) Foreign Application Priority Data

Apr. 24, 2008 (JP) ................................. 2008-114680

(51) Int. Cl.
G11C 29/00 (2006.01)
G11C 5/06 (2006.01)
G11C 7/00 (2006.01)
(52) U.S. Cl. ............................. 365/201; 365/63; 365/191
(58) Field of Classification Search ............. 365/201
See application file for complete search history.

(56) References Cited

U.S. PATENT DOCUMENTS

| | | | | |
|---|---|---|---|---|
| 5,726,939 A | * | 3/1998 | Cho et al. | 365/201 |
| 5,848,017 A | * | 12/1998 | Bissey | 365/201 |
| 5,999,467 A | * | 12/1999 | Bissey | 365/201 |
| 6,480,435 B2 | * | 11/2002 | Nakamura et al. | 365/207 |
| 7,443,748 B2 | * | 10/2008 | Aoki | 365/203 |
| 7,471,579 B2 | * | 12/2008 | Uchikoba et al. | 365/201 |
| 2001/0050870 A1 | | 12/2001 | Koshikawa | |
| 2002/0085445 A1 | * | 7/2002 | Itou | 365/230.06 |

FOREIGN PATENT DOCUMENTS

| | | |
|---|---|---|
| JP | 9-055099 | 2/1997 |
| JP | 2001-344996 | 12/2001 |

* cited by examiner

*Primary Examiner* — Son L Mai
(74) *Attorney, Agent, or Firm* — McDermott Will & Emery LLP

(57) ABSTRACT

A semiconductor memory device comprises a memory cell array having memory cells arranged at intersections of word lines and bit lines, a first sense amplifier connected to a bit line at a predetermined position of the bit lines, a second sense amplifier connected to a bit line adjacent to the bit line at the predetermined position, a supplying circuit for supplying a predetermined voltage to each bit line connected to the first or second sense amplifier, and a sense amplifier control circuit capable of controlling the first and second sense amplifiers independently. In the semiconductor memory device, the sense amplifier control circuit performs a control in which an operation of either of the first and second sense amplifiers is stopped, the predetermined voltage is supplied to the bit line connected to the stopped sense amplifier, and the other of the first and second sense amplifiers is operated.

20 Claims, 6 Drawing Sheets

FIG.2

EXAMPLES OF CONTROLLING ROWS OF SENSE AMPLIFIERS

|  |  | CONTROL STATE A | CONTROL STATE B |
|---|---|---|---|
| TEST MODE SIGNAL | TSE | High | Low |
|  | TSO | Low | High |
| SENSE AMPLIFIER START SIGNAL | SD0 | High | – |
|  | SD1 | – | High |
| SENSE AMPLIFIER ENABLE SIGNAL | SE0(E) | High | Low |
|  | SE1(O) | Low | High |
| ROW OF SENSE AMPLIFIERS | ODD NUMBER | OPERATION | STOP |
|  | EVEN NUMBER | STOP | OPERATION |

SEMICONDUCTOR MEMORY DEVICE AND TEST METHOD THEREOF

BACKGROUND OF THE INVENTION

1. Field of the Invention

The present invention relates to a semiconductor memory device having a configuration in which data stored in a memory cell is readout to a bit line, and particularly relates to a semiconductor memory device capable of performing a test of read data by controlling an operation of a sense amplifier connected to the bit line and to a test method thereof.

2. Description of Related Art

Generally, in a semiconductor memory device such as a DRAM (Dynamic Random Access Memory), a large number of memory cells are densely arranged with the progress of miniaturization, and therefore there is a case where a failure occurs, such as a short circuit of adjacent memory cells on the same word line. In order to prevent such a failure of memory cells, a test needs to be performed in manufacturing the DRAM to detect the failure. A general test for the DRAM determines whether or not read data is appropriate by transmitting data of a bit line connected to a memory cell to be tested to a sense amplifier, in a state where a predetermined word line is activated. Test methods using the sense amplifier are disclosed, for example, in Patent References 1 and 2.

Patent Reference 1

Japanese patent laid-open publication No. Hei 9-55099

Patent Reference 2

Japanese patent laid-open publication No. 2001-344996

Meanwhile, as the integration of the DRAM has been improved, it has become a general configuration in which a memory cell array is divided into a plurality of areas and rows of sense amplifiers are arranged between respective adjacent memory cell arrays. When the DRAM having such a configuration employs an open bit line structure, the rows of sense amplifiers are arranged on both sides of each region of the memory cell arrays, and a plurality of bit lines in each memory cell array are alternately connected to the rows of sense amplifiers on both sides in an arrangement order. Thereby, the bit lines can be arranged with a narrow pitch in the memory cell array, which is advantageous to improve the integration. In the memory cell array, memory cells are provided at all intersections of word lines and bit lines, and data of each memory cell on a selected word line can be read out by a sensing operation of the sense amplifier on the left or right side.

The above-mentioned test for preventing short circuit failures is also desired to be performed for the DRAM employing the open bit line structure. In this case, it is necessary to detect whether or not a short circuit failure exists based on data read out from adjacent memory cells on a predetermined word line. However, in a configuration in which the bit lines are alternately connected to the rows of sense amplifiers on both sides in the memory cell array having the open bit line structure, two bit lines to which two adjacent memory cells connected on the same word line are separately connected to the rows of sense amplifiers. Thus, the state of a bit line connected to an adjacent memory cell cannot be uniquely specified in a sensing operation for a focused memory cell. Therefore, there is a problem that it is difficult to appropriately detect the short circuit failure even when it exits. Further, in order to reliably detect the short circuit failure, the test is desired to be performed in a state where stress is applied between the two adjacent bit lines. However, a configuration for applying the above stress in the sensing operation for the focused memory cell has not been achieved.

SUMMARY

The present invention seeks to solve the above problems and provides a semiconductor memory device in which, when two bit lines connected to two adjacent memory cells on a word line are separately connected to sense amplifiers, stress is applied by individually controlling the respective sense amplifiers so that short circuit failures can be appropriately detected, and provides a test method thereof.

An aspect of the present invention is a semiconductor memory device comprising a memory cell array having a plurality of memory cells arranged at intersections of a plurality of word lines and a plurality of bit lines; a first sense amplifier connected to a bit line at a predetermined position of the plurality of bit lines; a second sense amplifier connected to a bit line adjacent to the bit line at the predetermined position; a supplying circuit for supplying a predetermined voltage to each bit line connected to the first or second sense amplifier; and a sense amplifier control circuit capable of controlling the first and second sense amplifiers independently; wherein the sense amplifier control circuit performs a control in which an operation of either of the first and second sense amplifiers is stopped, the predetermined voltage is supplied to the bit line connected to the stopped sense amplifier, and the other of the first and second sense amplifiers is operated.

According to the semiconductor memory device of the present invention, when data of memory cells are read out through a predetermined bit line, an operation of a sense amplifier connected to an adjacent bit line is stopped, and the bit line is controlled to receive the predetermined voltage. Thus, since stress is applied from the adjacent bit line on the side of the stopped sense amplifier to the bit line connected to the memory cell to be read, it is possible to set environment suitable for a read test or the like. At this point, even when a short circuit failure exits between two memory cells adjacent to each other on the same word line, respective sense amplifiers are individually controlled and the short circuit failure can be reliably detected due to whether or not read data can be read out based on the applied stress.

Another aspect of the present invention is a test method of a semiconductor memory device comprising a memory cell array having a plurality of memory cells arranged at intersections of a plurality of word lines and a plurality of bit lines, a first sense amplifier connected to a bit line at a predetermined position of the plurality of bit lines, a second sense amplifier connected to a bit line adjacent to the bit line at the predetermined position, and a supplying circuit for supplying a predetermined voltage to each bit line connected to the first or second sense amplifier, the method comprising: stopping an operation of either of the first and second sense amplifiers; supplying a predetermined voltage to a bit line connected to the stopped sense amplifier; activating a selected word line; operating the other of the first and second sense amplifiers so as to amplifier a voltage difference transmitted to a bit line connected thereto; and performing a test by detecting outputted read data.

As described above, according to the present invention, two bit lines connected to two memory cells adjacent to each other on a word line are connected to sense amplifiers capable of being controlled independently, one of the sense amplifiers is stopped and a predetermined voltage is supplied to the bit line connected to the stopped sense amplifier, so that the sensing operation can be performed in a state where stress is applied to the bit line connected to the other of the sense amplifiers. Accordingly, particularly when there is a problem of a short circuit failure between adjacent memory cells in a memory cell array employing the open bit line structure, it is possible to apply the stress by stopping a sense amplifier on one side, thereby performing a test capable of appropriately detecting the short circuit failure.

Further, according to the present invention, in a case where the numbers of bit lines and the number of sense amplifiers increase due to higher integration, the above described control can be performed for a configuration in which, for example, a plurality of rows of sense amplifiers and a plurality of memory cell arrays are alternately arranged. Then, when performing the parallel test for the plurality of rows of sense amplifiers, test results can be obtained while excluding read data of the stopped sense amplifier, so that an increase in the test time can be avoided by performing an effective parallel test.

BRIEF DESCRIPTION OF THE DRAWINGS

The above featured and advantages of the present invention will be more apparent from the following description of certain preferred embodiments taken in conjunction with the accompanying drawings, in which:

FIG. 2 is a diagram for explaining specific examples for controlling rows of sense amplifiers of the embodiment;

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes. In the following, one of the embodiments will be described in which the present invention is applied to a DRAM as a semiconductor device.

Figure 1:
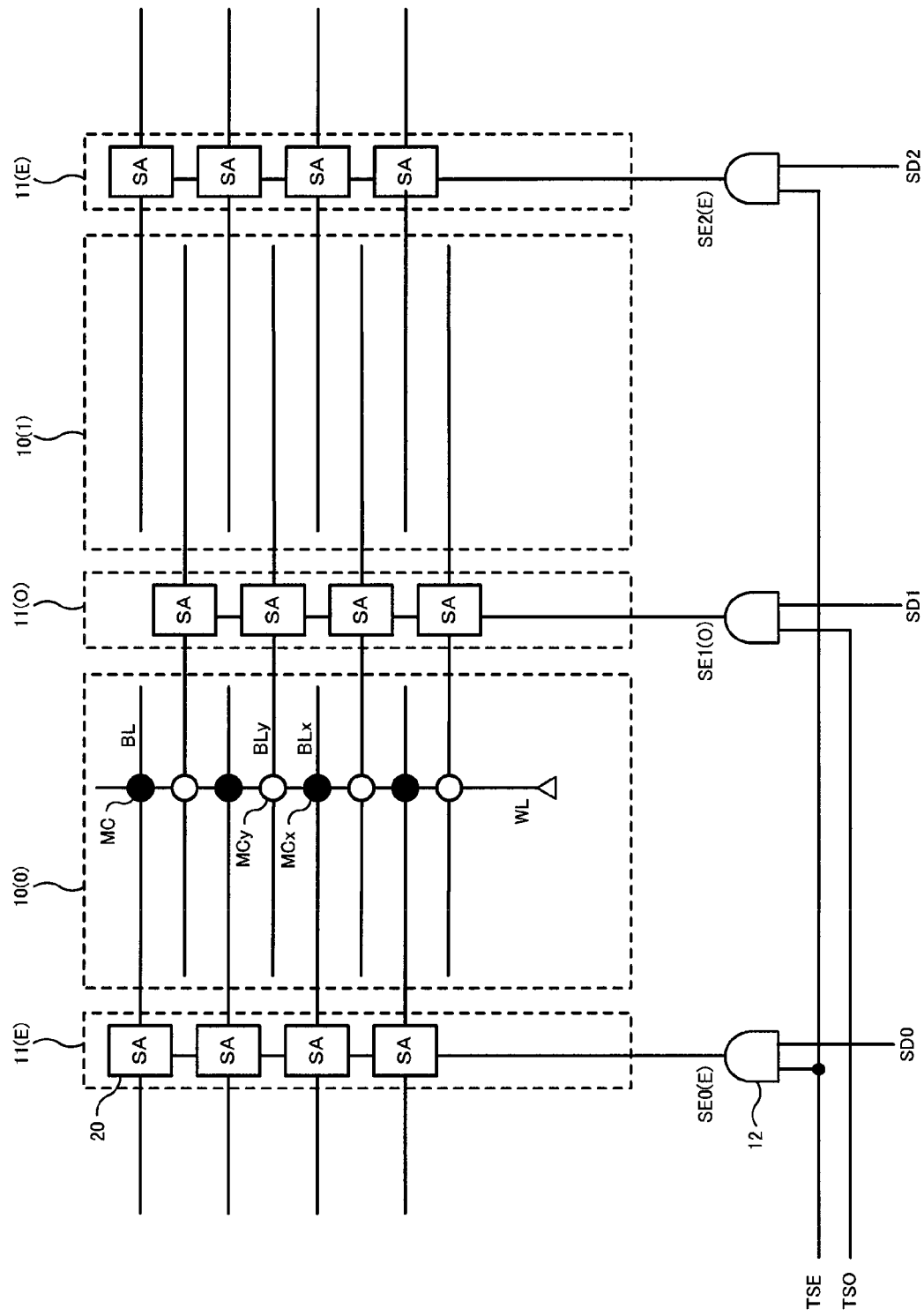
FIG. 1 is a block diagram showing a principal configuration of a DRAM of an embodiment.

FIG. 1 is a block diagram showing a principal configuration of the DRAM of the embodiment. In FIG. 1, there are shown a memory cell array 10 employing an open bit line structure, and rows of sense amplifiers 11 in each of which a plurality of sense amplifiers 20 are arranged. The example of FIG. 1 shows an area including two memory cell arrays 10(0) and 10(1) among a plurality of memory cell arrays 10 into which the entire area is divided. In each of the memory cell arrays 10(0) and 10(1), a plurality of word lines WL and a plurality of bit lines liens BL are arranged in a matrix form, and memory cells MC are formed at all intersections of the word lines and the bit lines. In FIG. 1, memory cells MC on one word line WL which is selected in the left side memory cell array 10(0) are only shown for simplicity.

The bit lines BL of the memory cell array 10 are alternately connected to the rows of sense amplifiers 11 on both sides. That is, when taking the left side memory cell array 10(0) as an example, the bit lines BL connected to the sense amplifiers 20 of the left side row of sense amplifiers 11(E) and the bit lines BL connected to the sense amplifiers 20 of the right side row of sense amplifiers 11(O) are alternately arranged. Thereby, the sense amplifiers 20 can be arranged with a pitch twice that of the bit lines BL. In addition, on the selected word line WL, the memory cells MC are distinctively indicated corresponding to the arrangement order of the bit lines BL connected to the rows of sense amplifiers 11 on both sides respectively (represented by black and white circles in the drawing).

The arrangement of FIG. 1 is repeated for the divided memory cell arrays 10 in a bit line extending direction, and even-numbered rows of sense amplifiers 11(E) and odd-numbered rows of sense amplifiers 11(O) are alternately arranged in the bit line extending direction. Each sense amplifier 20 included in the respective rows of sense amplifiers 11 is connected to one bit line BL of one adjacent memory cell array 10 and to one bit line BL of the other adjacent memory cell array 10, and operates to amplify a voltage difference between this pair of bit lines BL.

In the lower part of FIG. 1, there are shown three AND gates 12 connected to each of the rows of sense amplifiers 11. These AND gates 12 are included in a sense amplifier control circuit (not shown) and function to control operations of the respective rows of sense amplifiers 11 when performing a DRAM test. The AND gates 12 have one input terminals receiving a test mode signal TSE or TSO and the other input terminals receiving sense amplifier start signals SD0, SD1 and SD2 in this order from the left. Sense amplifier enable signals SE0(E), SE1(O) and SE2(E) are outputted from the AND gates 12 in this order from the left.

The above configuration enables to stop either of operations of the even row of sense amplifiers 11(E) and the odd row of sense amplifiers 11(O). When the both test mode signals TSE and TSO are high, both the even rows of sense amplifiers 11(E) and the odd rows of sense amplifiers 11(O) operate. On the other hand, by setting one of the test mode signals TSE and TSO to low, the even row of sense amplifiers 11(E) or the odd row of sense amplifiers 11(O) is selectively deactivated and its operation can be stopped. In this case, any of the sense amplifier start signals SD0, SD1 and SD2 corresponding to the row of sense amplifiers 11 to be stopped needs to be selectively controlled to be low.

Here specific examples for controlling the rows of sense amplifiers 11 will be described using FIG. 2. In FIG. 2, two control states A and B are shown for a case where the rows of sense amplifiers on both sides of the left side memory cell array 10(0) in FIG. 1 are controlled. First, in the control state A, both the test mode signal TSE and the sense amplifier start signal SD0 are controlled to be high, and the test mode signal TSO is controlled to be low. In this case, the sense amplifier enable signal SE0(E) becomes high so that the left side even row of sense amplifiers 11(E) operates, while the sense amplifier enable signal SE1(O) becomes low so that the operation of the right side odd row of sense amplifiers 11(O) is stopped. At this point, the sensing operation of the left side sense amplifier 20 is performed for data of a focused bit line BLx connected to a focused memory cell MCx shown in FIG. 1, and the sensing operation of the sense amplifier 20 being stopped is not performed for data of an adjacent bit line BLy connected to an adjacent memory cell MCy.

On the other hand, the control state B is controlled so that polarities of the respective signals in the control state A are all reversed. In this case, the operation of the left side even row of sense amplifiers 11(E) is stopped, and the right side odd row of sense amplifiers 11(O) operates. In FIG. 1, the sensing operation for the focused memory cell MCx and the adjacent memory cell MCy are reversed relative to the case of the control state A. In this manner, the control state can be switched in accordance with a position of a bit line BL connected to an arbitrary memory cell MC for the rows of sense amplifiers 11 on both sides of the memory cell array 10. Then, a control is performed in this embodiment so that a predetermined voltage is given to the bit line connected to the sense amplifier 20 in a stopped state in order to apply stress in the DRAM test, which will be described in detail later.

In the configuration of FIG. 1, two memory cell arrays 10 are arranged side by side, and eight bit lines BL are arranged in each memory cell array 10. However, the present invention is not limited to this configuration and various configurations can be employed. The present invention can be applied to a more general case in which N memory cell arrays 10 are arranged in a bit line extending direction and M bit lines BL are arranged in each memory cell array 10. In this case, N+1 rows of sense amplifiers 11 arranged on respective both sides of the N memory cell arrays 10 need to be provided and controlled depending on the even/odd row.

Figure 3:
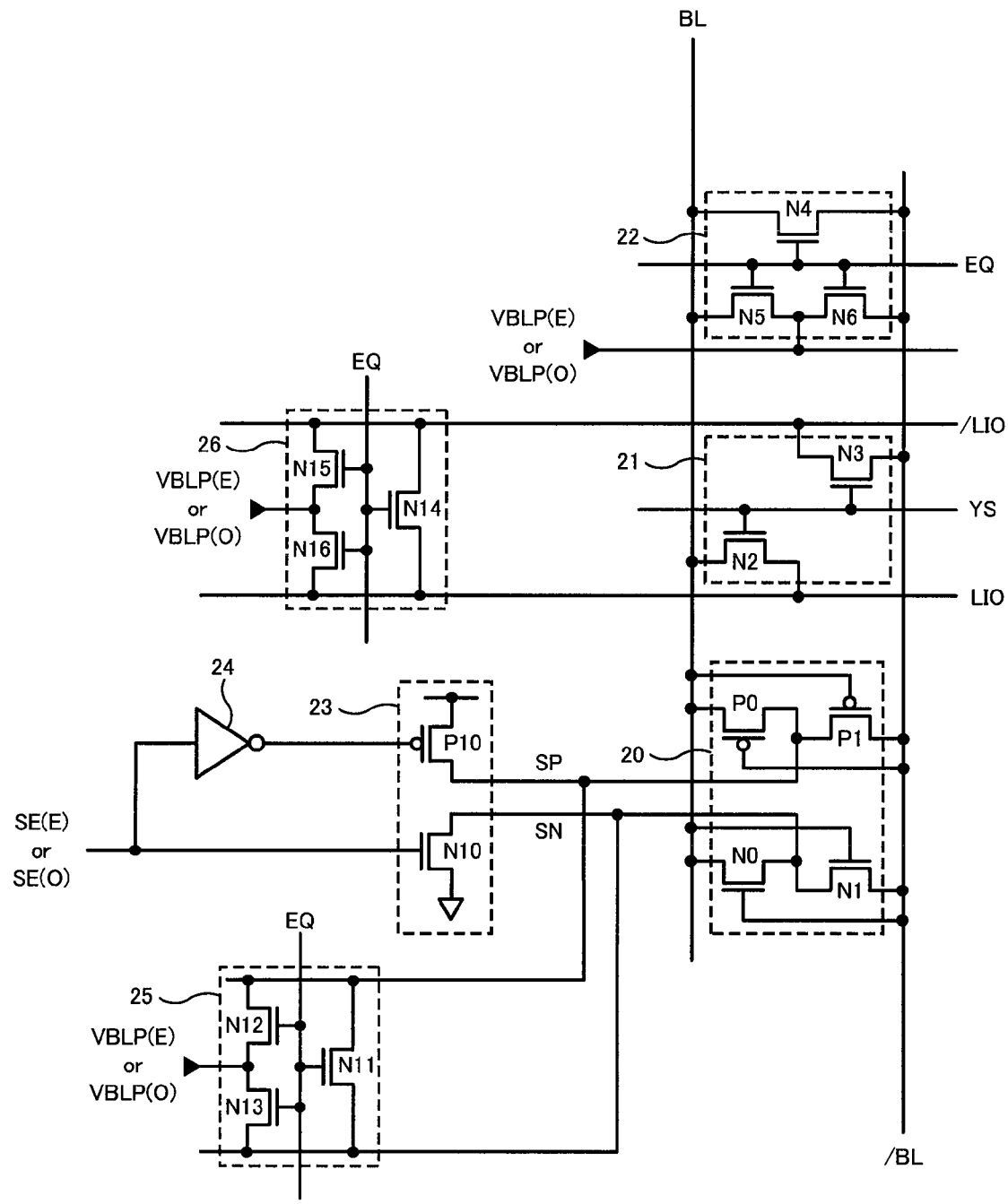
FIG. 3 is a diagram showing a circuit configuration of a sense amplifier of the row of sense amplifiers of FIG. 1 and its peripheral circuit.

Next, FIG. 3 shows a circuit configuration of the sense amplifier 20 of the row of sense amplifiers 11 and its peripheral circuit in FIG. 1. The circuit configuration shown in FIG. 3 includes a sense amplifier 20 connected to a pair of bit lines BL and /BL, a Y-switching circuit 21 for outputting data to a pair of input/output lines LIO and /LIO, a bit line equalize circuit 22 for precharging and equalizing the pair of bit lines BL and /BL, a drive circuit 23 for driving the sense amplifier 20, an inverter 24 connected to the drive circuit 23, a power supply line equalize circuit 25 for precharging and equalizing a pair of power supply lines SP and SN connected to the sense amplifier 20, and an input/output line equalize circuit 26 for precharging and equalizing the pair of input/output lines LIO and /LIO. Two memory cell arrays 10 are adjacent to each other across the row of sense amplifiers 11 including the sense amplifier 20, and the bit lines BL are arranged in one of the memory cell arrays 10 while the bit lines /BL are arranged in the other thereof.

In FIG. 3, the sense amplifier 20 is composed of two P-channel type MOS transistors (Hereinafter, referred to as "PMOS transistors") P0 and P1, and two N-channel type MOS transistors (Hereinafter, referred to as "NMOS transistors") N0 and N1. Among these, the PMOS transistor P0 and the NMOS transistor N0 form a pair and the bit line BL is connected to a commonly connected drain thereof while the bit line /BL is connected to a commonly connected gate thereof. Further, the PMOS transistor P1 and the NMOS transistor N1 form a pair and the bit line /BL is connected to a commonly connected drain thereof while the bit line BL is connected to a commonly connected gate thereof. The sense amplifier 20 is activated by a power supply voltage supplied form the drive circuit 23, and thereby a minute voltage difference transmitted to the pair of bit lines BL and /BL can be amplified.

The Y-switching circuit 21 is composed of two NMOS transistors N2 and N3. The NMOS transistor N2 is connected between the bit line BL and one input/output line LIO, and the NMOS transistor N3 is connected between the bit line /BL and the other input/output line /LIO. Conduction of each of the NMOS transistors N2 and N3 is controlled in response to a selection signal YS applied to the gate. Thereby, read data amplified by the sense amplifier 20 through the pair of bit lines BL and /BL can be outputted to the pair of input/output lines LIO and /LIO.

The bit line equalize circuit 22 (the supplying circuit of the present invention) is composed of three NMOS transistors N4, N5 and N6. One NMOS transistor N4 and series connected two NMOS transistors N5 and N6 are connected between the pair of bit lines BL and /BL. Conduction of each of the three NMOS transistors N4, N5 and N6 is controlled in response to an equalize control signal EQ applied to a commonly connected gate. The series connected NMOS transistors N5 and N6 have a function of precharging the pair of bit lines BL and /BL to a precharge voltage VBLP(E) or VBLP (O) which is set to a predetermined voltage. Further, the NMOS transistor N4 has a function of balancing the pair of bit lines BL and /BL at the same voltage.

In this manner, two types of the bit line equalize circuit 22 for applying different precharge voltages VBLP(E) and VBLP(O) are provided corresponding to the even row of sense amplifiers 11(E) and the odd row of sense amplifiers 11(O). The precharge voltages VBLP(E) and VBLP(O) are set to, for example, an array voltage or a grand potential. Thereby, the predetermined voltage is supplied to the pair of bit lines BL and /BL through the bit line equalize circuit 22, in a state where the sense amplifier 20 is deactivated, so that the stress can be applied in the later mentioned test.

The drive circuit 23 is a circuit for driving the sense amplifier 20 through the pair of power supply lines SP and SN, and composed of a PMOS transistor P10 connected between a predetermined power supply voltage and one power supply line SP and an NMOS transistor N10 connected between a predetermined grand potential and the other power supply line SN. The one power supply line SP is connected to the source of the two PMOS transistors P0 and P1 of the sense amplifier 20, and the other power supply line SN is connected to the source of the two NMOS transistors N0 and N1 of the sense amplifier 20. The above sense amplifier enable signal SE(E) or SE(O) is applied to the gate of the NMOS transistor N10, and an inverted signal of the sense amplifier enable signal SE(E) or SE(O) is applied through the inverter 24 to the gate of the PMOS transistor P10. In addition, the sense amplifier enable signals SE(E) and SE(O) are supplied to rows of sense amplifiers 11(E) and 11(O) at arbitrary positions if a large number of rows of sense amplifiers 11 are arranged in the example of FIG. 1.

The power supply line equalize circuit 25 is composed of three NMOS transistors N11, N12 and N13, and operates to precharge the pair of power supply lines SP and SN to the precharge voltage VBLP (E) or VBLP(O) and to set these lines at the same voltage. Similarly, the input/output line equalize circuit 26 is composed of three NMOS transistors N14, N15 and N16, and operates to precharge the pair of input/output lines LIO and /LIO to the precharge voltage VBLP(E) or VBLP(O) and to set these lines at the same voltage. In addition, connection and operation of the power supply line equalize circuit 25 and the input/output line equalize circuit 26 are the same as those of the bit line equalize circuit 22, so description thereof will be omitted. However, the precharge voltage VBLP applied to the power supply line equalize circuit 25 and the input/output line equalize circuit 26 is controlled separately from the precharge voltage VBLP (E) or VBLP (O) applied to the bit line equalize circuit 22.

Figure 4:
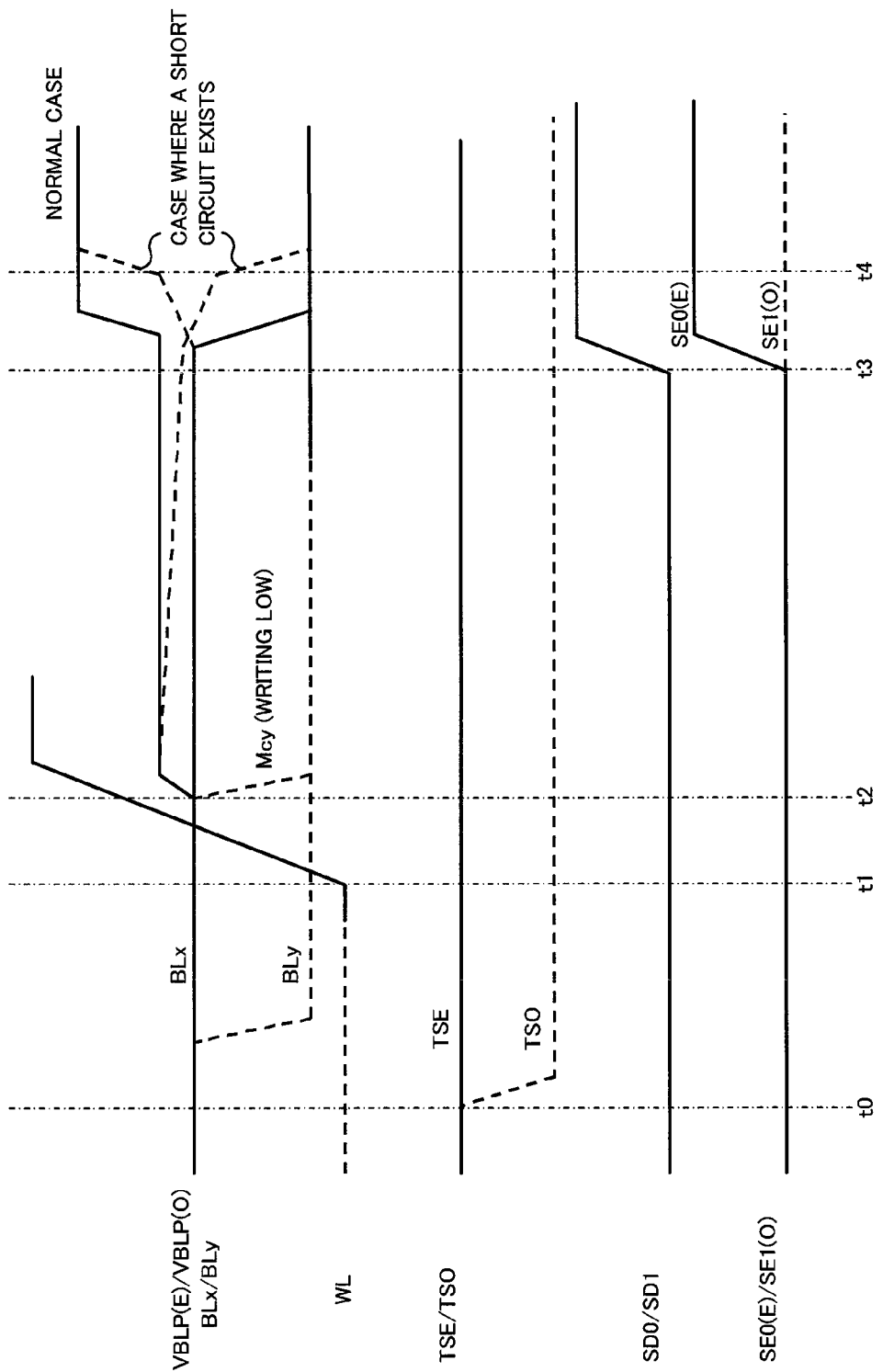
FIG. 4 is a diagram showing operation waveforms when performing a DRAM test of the embodiment.

Next, an operation of performing the DRAM test of the embodiment will be described with reference to FIG. 4. An example of the test shown in FIG. 4 corresponds to a case where the focused memory cell MCx maintaining high data in FIG. 1 is read out while applying stress from the adjacent bit line BLy to the focused bit line BLx in order to detect a short circuit failure between the focused memory cell MCx and the adjacent memory cell MCy. In the upper part of FIG. 4, operation waveforms of the focused bit line BLx, the adjacent bit line BLy, the precharge voltages VBLP(E) and VBLP(O), and the word line WL are shown together. Further, in the lower part of FIG. 4, operation waveforms of the test mode signals TSE and TSO, the sense amplifier start signals SD0 and SD1, the sense amplifier enable signals SE0(E) and SE1 (O) of FIG. 1 are shown together.

First, the test mode signal TSO is switched from high to low at timing t0 in order to stop the operation of the odd row of sense amplifiers 11(O) connected to the adjacent bit line BLy. At this point, the test mode signal TSE is maintained high. Subsequently, the precharge voltage VBLP(O) of the bit line equalize circuit 22 corresponding to the odd row of sense amplifiers 11(O) is set to the grand potential. Since the focused memory cell MCx maintains high, it is necessary to set the grand potential of reverse polarity so as to write it to the adjacent memory cell MCy. Then, the equalizing control line EQ is controlled to be high for the bit line equalize circuit 22 corresponding to the odd row of sense amplifiers 11(O), so that the grand potential is supplied to the adjacent bit line BLy.

The selected word line WL is activated at subsequent timing t1, and the word line WL slowly rises from a negative voltage to a positive voltage. Thereby, a minute signal is read out to the focused bit line BLx corresponding to accumulated charge of the focused memory cell MCx at timing t2. Since the grand potential is applied to the adjacent bit line BLy at this time, low level is written to the adjacent memory cell MCy. That is, the stress is applied between the focused memory cell MCx and the adjacent memory cell MCy on the same word line WL. A subsequent operation differs depending on whether or not the short circuit failure exists between the focused memory cell MCx and the adjacent memory cell MCy.

The sense amplifier start signals SD0 and SD1 are switched from low to high at timing t3 at which a sufficient predetermined time elapses, and the sense amplifier enable signal SE0(E) changes from low to high at the same time. Thereby, in the even row of sense amplifiers 11(E), the operation of each sense amplifier 20 is started by the drive circuit 23. On the other hand, in the odd row of sense amplifiers 11(O), the operation of each sense amplifier 20 is not started since the sense amplifier enable signal SE1(O) is maintained low. At this point, when the short circuit failure does not exist, the voltage of the focused bit line BLx is amplified to a high level by a normal sensing operation of the sense amplifier 20 at the timing t3, from a state in which the minute signal of the focused bit line BLx is maintained.

In contrast, when the short circuit failure exists, the level of the minute signal of the focused bit line BLx to which the stress is being applied gradually decreases from the timing t2 to the timing t3 due to current leak to the adjacent memory cell MCy. Then, when the sense amplifier 20 starts to operate at the timing t3, the level of the focused bit line BLx further decreases and finally reaches the grand potential so that the sensing operation fails. Accordingly, a difference corresponding to whether or not the short circuit failure exists can be determined based on the data outputted from the sense amplifier 20, and therefore it is possible to detect the short circuit failure between the focused memory cell MCx and the adjacent memory cell MCy.

Next, a circuit for parallel test required in the DRAM test of the embodiment will be described. Generally, in a read test of the DRAM, a method for detecting read data from a plurality of memory cell arrays 10 at the same time is employed in order to shorten the test time. However, in the case of the embodiment, test results of operating one of the even row of sense amplifiers 11(E) and the odd row of sense amplifiers 11(O) are valid, while read data of the row being stopped cannot essentially be read out and is to be invalid, so that a corresponding configuration needs to be added.

Figure 5:
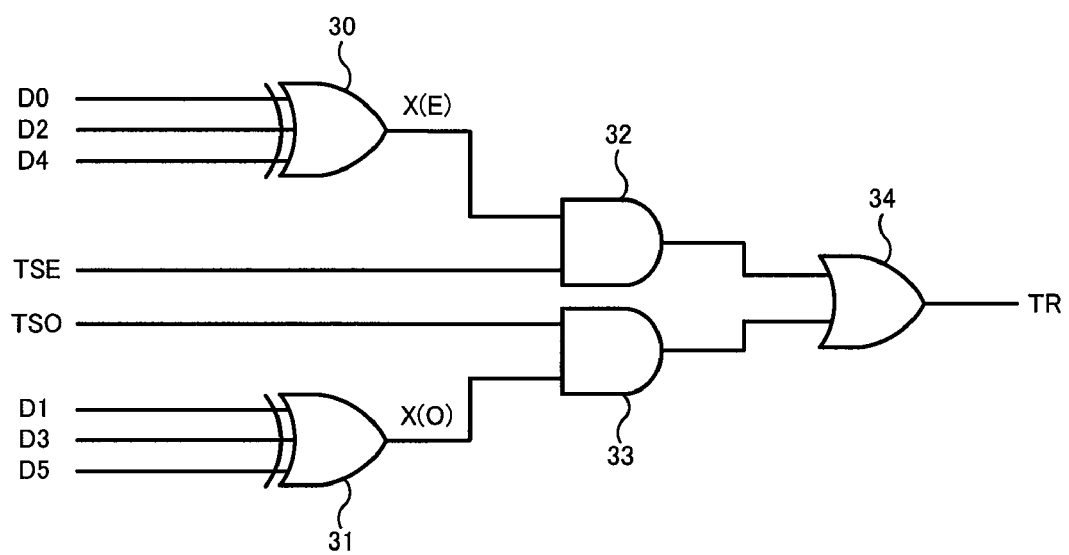
FIG. 5 is a diagram showing a configuration example of a circuit for parallel test added to the DRAM of the embodiment.
Figure 6:
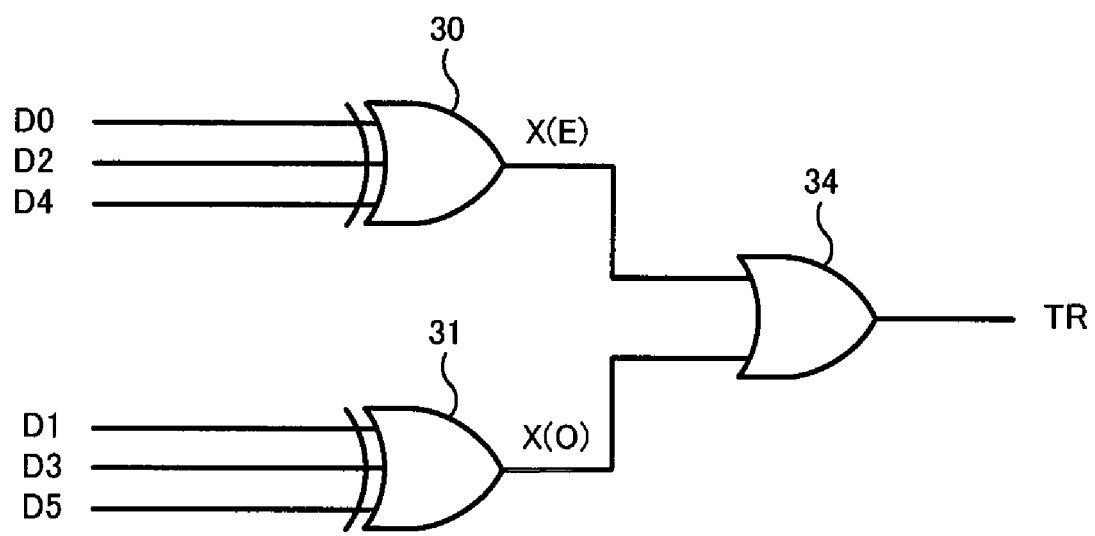
FIG. 6 is a diagram showing a configuration of the circuit for parallel test used in the conventional DRAM in order to compare with FIG. 5.

FIG. 5 shows a configuration example of the circuit for parallel test added to the DRAM of the embodiment. FIG. 6 shows a comparison example of a configuration of the circuit for parallel test used in the conventional DRAM in order to compare with FIG. 5. The configuration example of FIG. 5 includes two EXOR gates 30, 31, two AND gates 32, 33, and one OR gate 34. On the other hand, the configuration example of FIG. 6 includes the two EXOR gates 30, 31 and the one OR gate 34 without the two AND gates 32 and 33 of FIG. 5.

In FIGS. 5 and 6, the EXOR gate 30 receives read data D0, D2 and D4 from the even row of sense amplifiers 11(E), and the EXOR gate 31 receives read data D1, D3 and D5 from the odd row of sense amplifiers 11(O). Here, a case is shown where each of the EXOR gates 30 and 31 receives three pieces of read data for simplicity, however it may be configured to receive a larger number of pieces of read data.

In the configuration example of FIG. 6, an output X(E) of the EXOR gate 30 and an output X(O) of the EXOR gate 31 are directly inputted to the OR gate 34. A test result TR outputted from the OR gate 34 is low in a normal case, and changes to high when a failure is detected. Thus, when all pieces of read data D0 to D5 are identical to one another, both the outputs X(E) and X(O) are low so that the test result TR outputted from the OR gate 34 is low (normal). When the pieces of read data D0 to D5 are mismatched, both or either of the outputs X(E) and X(O) are high and the test result TR outputted from the OR gate 34 is high (failure).

In contrast, in the configuration example of FIG. 5 of the embodiment, the AND gate 32 receives the output X(E) of the EXOR gate 30 and the test mode signal TSE. Further, the AND gate 33 receives the output X(O) of the EXOR gate 31 and the test mode signal TSO. Thus, when the operation of the row of sense amplifiers 11(E) is stopped, the test mode signal TSE is low and the output of the AND gate 32 is low regardless of the read data D0, D2 and D4. Further, when the operation of the odd row of sense amplifiers 11(O) is stopped, the test mode signal TSO is low and the output of the AND gate 33 is low regardless of the read data D1, D3 and D5. Then, since the OR gate 34 receives the outputs of the two AND gates 32 and 33, the above test result TR is outputted reflecting only the read data of the operating row of sense amplifiers 11.

Accordingly, by employing the configuration example of FIG. 5, read data of the stopped row of sense amplifiers 11 is forcibly passed and a parallel test using the read data of the operating row of sense amplifiers 11 can be performed. Thereby, the configuration for detecting the short circuit failure between adjacent memory cells MC is employed and an increase in the test time can be avoided in the memory cell array 10 employing the open bit line structure.

In the foregoing, contents of the present invention have been specifically described based on the embodiment, however the present invention is not limited to the above described embodiment and can variously be modified without departing the essentials of the present invention. That is, the present invention is not limited to configurations of FIGS. 1 and 3, and can be applied to DRAMs having various configurations. Further, the DRAM having a plurality of memory cell arrays 10 and a plurality of rows of sense amplifiers has been described in the embodiment, however the present invention can be applied to a case where the function and operation of the embodiment are achieved in only part of the memory cell array 10 and the row of sense amplifiers 11. Furthermore, the present invention is not limited to the DRAM as a semiconductor memory device and can be widely applied to semiconductor memory devices other than DRAMs.

What is claimed is:

1. A semiconductor memory device comprising:
    a memory cell array having a plurality of memory cells, a plurality of word lines, a plurality of bit lines, an associated one of the memory cells being arranged at each of a plurality of intersections of the plurality of word lines and the plurality of bit lines;
    a first sense amplifier connected to a first bit line at a predetermined position of the plurality of bit lines;
    a second sense amplifier connected to a second bit line adjacent to the bit line;
    a supplying circuit for supplying a predetermined voltage to each bit line connected to the first or second sense amplifier; and
    a sense amplifier control circuit capable of controlling the first and second sense amplifiers independently;
    wherein the sense amplifier control circuit performs a control in which an operation of either of the first and second sense amplifiers is stopped, the predetermined voltage is supplied to the bit line connected to the stopped sense amplifier, and the other of the first and second sense amplifiers is operated.

2. The semiconductor memory device according to claim 1, wherein when a selected word line is activated, the predetermined voltage is set to a predetermined power supply voltage or a predetermined ground potential for applying stress between two adjacent bit lines.

3. The semiconductor memory device according to claim 1 further comprising:
    a first row of sense amplifiers including a plurality of first sense amplifiers arranged on one side of the memory cell array; and
    a second row of sense amplifiers including a plurality of second sense amplifiers arranged opposite to the first row of sense amplifiers on another side of the memory cell array,
    wherein the plurality of bit lines are arranged so as to be alternately connected to the first and second sense amplifiers.

4. The semiconductor memory device according to claim 3, wherein a plurality of memory cell arrays are arranged, and the first and second rows of sense amplifiers are alternately arranged across each of the memory cell arrays.

5. A semiconductor memory device comprising:
    a memory cell array having a plurality of memory cells arranged at intersections of a plurality of word lines and a plurality of bit lines;
    a first sense amplifier connected to a bit line at a predetermined position of the plurality of bit lines;
    a second sense amplifier connected to a bit line adjacent to the bit line at the predetermined position;
    a supplying circuit for supplying a predetermined voltage to each bit line connected to the first or second sense amplifier; and
    a sense amplifier control circuit capable of controlling the first and second sense amplifiers independently;
    wherein the sense amplifier control circuit performs a control in which an operation of either of the first and second sense amplifiers is stopped, the predetermined voltage is supplied to the bit line connected to the stopped sense amplifier, and the other of the first and second sense amplifiers is operated;

the semiconductor memory device further comprising:
    a first row of sense amplifiers including a plurality of first sense amplifiers arranged on one side of the memory cell array; and
    a second row of sense amplifiers including a plurality of second sense amplifiers arranged opposite to the first row of sense amplifiers on another side of the memory cell array,
    wherein the plurality of bit lines are arranged so as to be alternately connected to the first and second sense amplifiers,
    a plurality of memory cell arrays are arranged, and the first and second rows of sense amplifiers are alternately arranged across each of the memory cell arrays, and
    the memory cell arrays are formed in an open bit line structure and each of the first and second sense amplifiers is connected to a pair of bit lines of adjacent two of the memory cell arrays.

6. The semiconductor memory device according to claim 5, wherein the supplying circuit is a bit line equalize circuit for precharging the pair of bit lines based on a precharge voltage set to the predetermined voltage and for setting the pair of bit lines at the same voltage.

7. The semiconductor memory device according to claim 4, wherein the sense amplifier control circuit controls an operation of one or more first rows of sense amplifiers by supplying a first test mode signal commonly thereto and controls an operation of one or more second rows of sense amplifiers by supplying a second test mode signal commonly thereto.

8. A test method of a semiconductor memory device comprising a memory cell array having a plurality of memory cells, a plurality of word lines, and a plurality of bit lines, an associated one of the memory cells being arranged at each of a plurality of intersections of the plurality of word lines and the plurality of bit lines, a first sense amplifier connected to a first bit line of the plurality of bit lines, a second sense amplifier connected to a second bit line adjacent to the first bit line, and a supplying circuit for supplying a predetermined voltage to either one of the first bit line and second bit line, the method comprising:
    activating a selected word line;
    operating the first sense amplifier so as to amplify a voltage difference transmitted to the first bit line connected to the first sense amplifier;
    deactivating the second sense amplifier during the operating;
    keeping supply of the predetermined voltage to the second bit line connected to the second sense amplifier during the operating; and
    performing a test by detecting outputted read data.

9. The test method according to claim 8, wherein the predetermined voltage is supplied to the second bit line adjacent to the first bit line connected to a memory cell for testing so as to allow data whose polarity is reverse to data stored in the memory cell for testing to be written.

10. The test method according to claim 8,
    wherein the plurality of bit lines are arranged so as to be alternately connected to the first and second sense amplifiers,
    and an operation of a plurality of first sense amplifiers included in the first row of sense amplifiers is commonly controlled and an operation of a plurality of second sense amplifiers included in the second row of sense amplifiers is commonly controlled.

11. The test method according to claim 10,
wherein a plurality of the memory cell arrays are arranged and the first and second rows of sense amplifiers are alternately arranged across each of the memory cell arrays,
and an operation of a plurality of the first rows of sense amplifiers is commonly controlled and an operation of a plurality of the second rows of sense amplifiers is commonly controlled.

12. The test method according to claim 11, wherein a parallel test is performed by detecting respective pieces of read data of the plurality of the first rows of sense amplifiers and respective pieces of read data of the plurality of the second rows of sense amplifiers at a same time.

13. The test method according to claim 12, wherein the parallel test is performed by excluding read data of one or more stopped rows of sense amplifiers among the first and second rows of sense amplifiers.

14. A semiconductor memory device comprising:
a word line;
a first bit line;
a second bit line adjacent to the first bit line;
a first memory cell connected to the first bit line;
a second memory cell connected to the second bit line;
a first sense amplifier connected to the first bit line;
a second sense amplifier connected to the second bit line; and
a control circuit that precharges each of the first and second bit lines to a precharge level and changes the first bit line to a first level while maintaining the second bit line at the precharge level before the word line is changed to an active level, the precharge level being different from the first level; the control circuit further allowing, in response to a change of the word line to the active level, the second bit line to change to a potential level responsive to a data stored in the second memory cell while maintaining the first bit line at the first level.

15. The semiconductor memory device according to claim 14, wherein the first and second bit lines are arranged in substantially parallel to each other between the first sense amplifier and the second sense amplifier.

16. The semiconductor memory device according to claim 15, further comprising a third bit line connected to the first sense amplifier and arranged on an opposite side to the first bit line with respect to the first sense amplifier and a fourth bit line connected to the second sense amplifier and arranged on an opposite side to the second bit line with respect to the second sense amplifier.

17. The semiconductor memory device according to claim 14, wherein the first level is lower than the precharge level.

18. The semiconductor memory device according to claim 14, wherein the first and second memory cells are disposed respectively at an intersection of the first bit line and the word line and at an intersection of the second bit line and the word line.

19. The semiconductor memory device according to claim 14, wherein the control circuit further activates the second sense amplifier while keeping the first sense amplifier deactivated in response to the change of the word line to the active level.

20. The semiconductor memory device according to claim 19, wherein the control circuit further allows the first bit line to maintain at the first level while the second sense amplifier is activated.

* * * * *